(12) United States Patent
Chung

(10) Patent No.: US 8,363,409 B2
(45) Date of Patent: Jan. 29, 2013

(54) INTEGRATED DEVICE OF HEAT DISSIPATION UNIT AND PACKAGE COMPONENT AND A FASTENING STRUCTURE FOR THE SAME

(75) Inventor: Yi-Chiu Chung, New Taipei (TW)

(73) Assignee: Chicony Power Technology Co., Ltd., New Taipei (TW)

( * ) Notice: Subject to any disclaimer, the term of this patent is extended or adjusted under 35 U.S.C. 154(b) by 164 days.

(21) Appl. No.: 13/008,663

(22) Filed: Jan. 18, 2011

(65) Prior Publication Data

US 2012/0182691 A1    Jul. 19, 2012

(51) Int. Cl.
*H05K 7/20*    (2006.01)
(52) U.S. Cl. ........ 361/713; 361/707; 361/710; 361/715; 361/728; 165/104.33; 174/258
(58) Field of Classification Search .................. 361/688, 361/701–704, 707–715, 728
See application file for complete search history.

(56) References Cited

U.S. PATENT DOCUMENTS

| | | | | |
|---|---|---|---|---|
| 4,204,248 A | * | 5/1980 | Proffit et al. ................... | 361/707 |
| 4,460,917 A | * | 7/1984 | Rogers ........................... | 257/717 |
| 4,707,726 A | * | 11/1987 | Tinder ............................ | 174/252 |
| 6,781,840 B2 | * | 8/2004 | Ikushima et al. .............. | 361/707 |
| 7,589,970 B2 | * | 9/2009 | Hsieh .............................. | 361/707 |
| 2002/0141161 A1 | * | 10/2002 | Matsukura et al. ........... | 361/713 |
| 2006/0121703 A1 | * | 6/2006 | Huang ............................ | 438/487 |
| 2006/0193118 A1 | * | 8/2006 | Ahmad et al. ................. | 361/760 |

\* cited by examiner

*Primary Examiner* — Courtney Smith
(74) *Attorney, Agent, or Firm* — Chun-Ming Shih; HDLS IPR Services

(57) ABSTRACT

The integrated device of a heat dissipation unit and a package component includes a non-insulation type package component, an insulation sheet, a heat dissipation unit, a fastener, a washer and a sleeve. The non-insulation package component has a metal tab with a through hole. The insulation sheet is provided with a via hole and attached on one side of the metal tab. The heat dissipation unit is provided with a tapped hole corresponding to the through hole. The sleeve includes a narrow portion penetrating the via hole and through and a wide portion sandwiched between the insulation sheet and heat dissipation unit. When the fastener penetrates into the through hole of the metal tab and the via hole of the insulation sheet and screws into the tapped hole, the fastener will pass through the sleeve without contact with the insulation sheet due to the protection of the narrow portion in the via hole.

11 Claims, 7 Drawing Sheets

INTEGRATED DEVICE OF HEAT DISSIPATION UNIT AND PACKAGE COMPONENT AND A FASTENING STRUCTURE FOR THE SAME

BACKGROUND OF THE INVENTION

1. Technical Field

The invention relates to the heat dissipation of electronic components, particularly to fastening structures and heat dissipation of the non-insulation package components.

2. Related Art

Modern electronic components tens to high speed and/or high frequency, so there are many electronic components associated with heat dissipation units. For example, TO-220 is a common packaging specification used for transistors and silicon-controlled rectifiers (SCRs) as shown in FIG. 1. The TO-220 components are a kind of non-insulation type package component. It features a rectangular metal tab 11 protruding from the bottom of a plastic package. The metal tab 11 is provided with a through hole 111 with a diameter of about 3.6 mm for being penetrated by a fastener 2 to screw into a tapped hole 41 of the heat dissipation unit 4. In order to insulate the metal tab 11 against the heat dissipation unit 4, an insulation sheet 3 must be sandwiched therebetween. The insulation sheet 3 is provided with a via hole 31 corresponding to the through hole 111. Because the insulation sheet 3 is a sheet of soft plastic, to prevent the via hole 31 from being damaged by the fastener 2, a two-stepped washer 22 must be disposed.

The washer 22 is composed of a narrow portion 221 and a wide portion 222. The wide portion 222 is sandwiched between a head 21 of the fastener 2 and the metal tab 11. The narrow portion 221 penetrates into the through hole 111 and via hole to protect an edge of the via hole 31. However, in a production line, the metal tab 11, insulation sheet 3 and heat dissipation unit 4 are overlapped in advance to align the though hole 111 with the via hole 31 and tapped hole 41. On the other hand, the fastener 2 first penetrates the washer 22 and then penetrates the through hole 111, via hole 31 and tapped hole 41 as shown in FIG. 2. The fastener 2 tends to split or scratch the edge of the via hole 31 while it is penetrating these holes 111,31,41. The damaged via hole 31 cannot completely insulate the metal tab 11 against the heat dissipation unit 4. As a result, an electric arc may happen.

SUMMARY OF THE INVENTION

An object of the invention is to provide an integrated device of a heat dissipation unit and a package component, which provides accurate alignment between the heat dissipation unit and the non-insulation type package component and keeps the insulation to avoid electric arcs.

To accomplish the above object, the invention provides an integrated device of a heat dissipation unit and a package component, which includes a non-insulation type package component, an insulation sheet, a heat dissipation unit, a fastener, a washer and a sleeve. The non-insulation package component has a metal tab with a through hole. The insulation sheet is provided with a via hole and attached on one side of the metal tab. The heat dissipation unit is provided with a tapped hole corresponding to the through hole. The sleeve includes a narrow portion penetrating the via hole and through and a wide portion sandwiched between the insulation sheet and heat dissipation unit. When the fastener penetrates into the through hole of the metal tab and the via hole of the insulation sheet and screws into the tapped hole, the fastener will pass through the sleeve without contact with the insulation sheet due to the protection of the narrow portion in the via hole.

Another object of the invention is to provide a fastening structure for a package component and a heat dissipation unit, which has a sleeve penetrating the insulation sheet to prevent the via hole from being damaged.

To accomplish the above object, the invention provides a fastening structure used for fix a heat dissipation unit on a package component and sandwiching an insulation sheet therebetween, which includes a fastener, a washer and a sleeve. The fastener has a head and penetrates the non-insulation type package component and insulation sheet to screw into the heat dissipation unit. The washer is put around the fastener and sandwiched between the non-insulation type package component and the head of the fastener. The sleeve is penetrated by the fastener and includes a narrow portion and a wide portion. The narrow portion penetrates the non-insulation type package component through the insulation sheet. The wide portion is sandwiched between the insulation sheet and heat dissipation unit When the fastener penetrates into the through hole of the metal tab and the via hole of the insulation sheet and screws into the tapped hole, the fastener will pass through the sleeve without contact with the insulation sheet due to the protection of the narrow portion in the via hole.

DETAILED DESCRIPTION OF THE INVENTION

Figure 1:
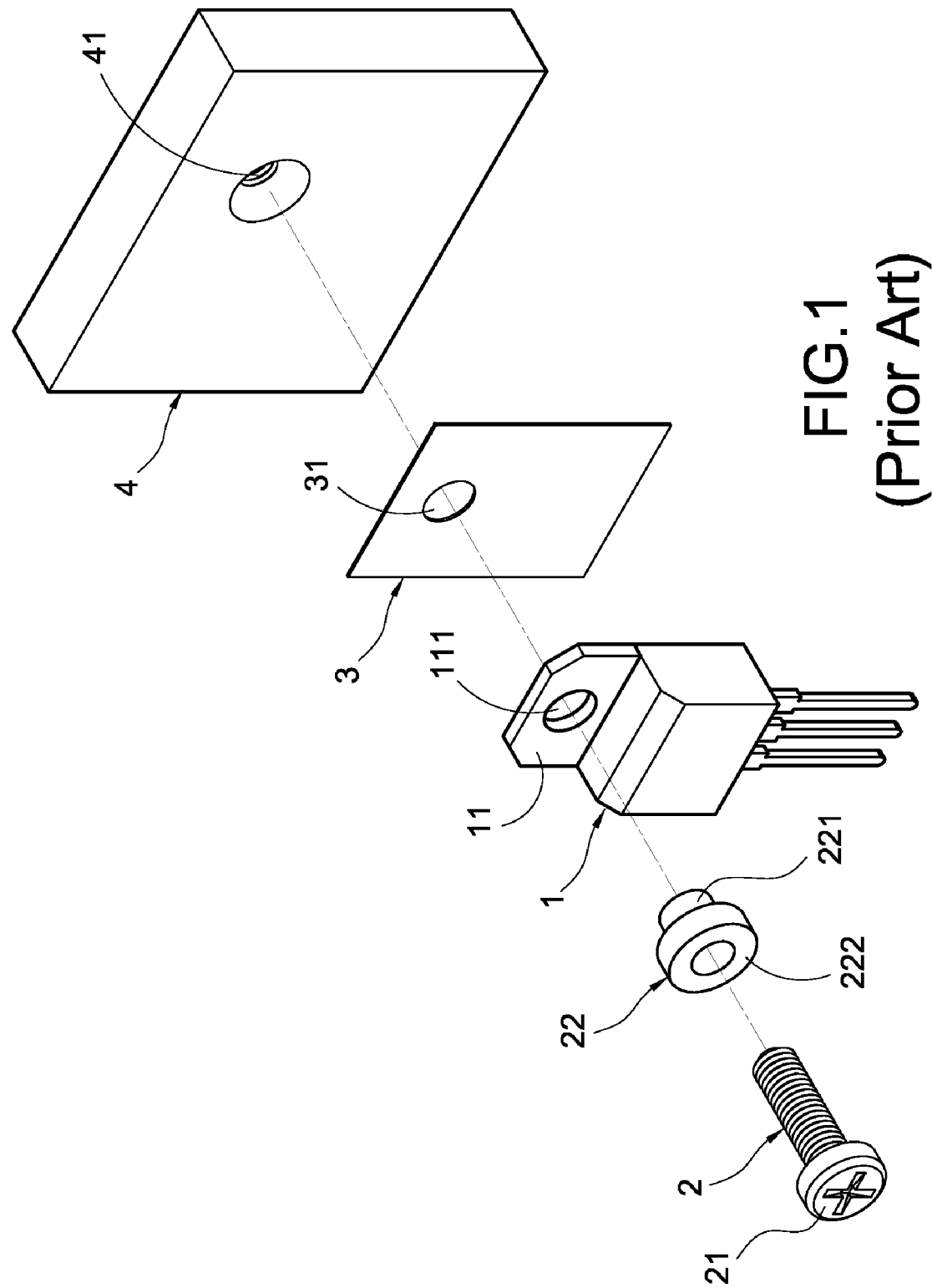
FIG. 1 is an exploded perspective view of the conventional fastening structure for a package component and a heat dissipation unit.
Figure 2:
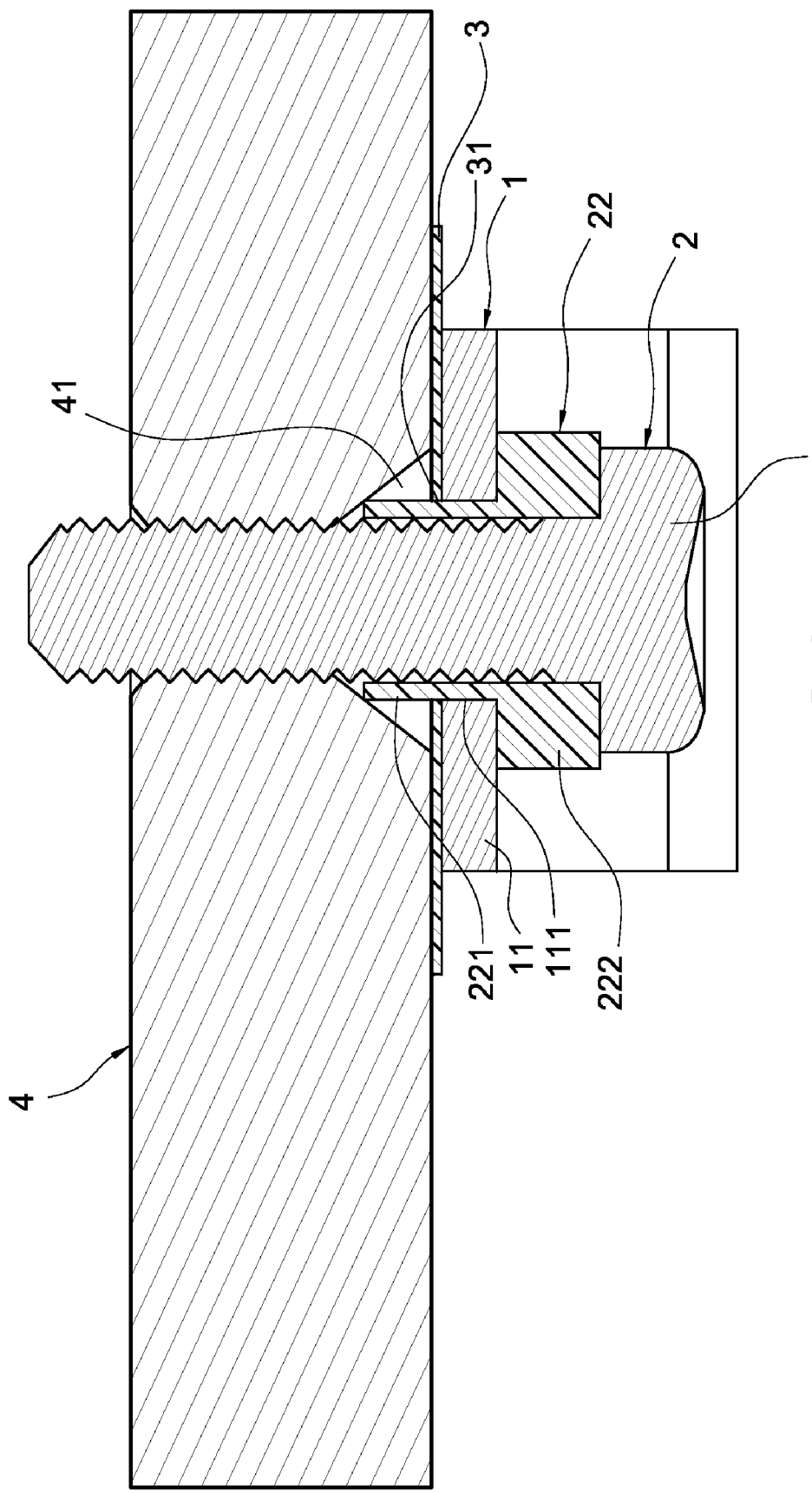
FIG. 2 is a cross-sectional view of the conventional fastening structure for a package component and a heat dissipation unit.
Figure 3:
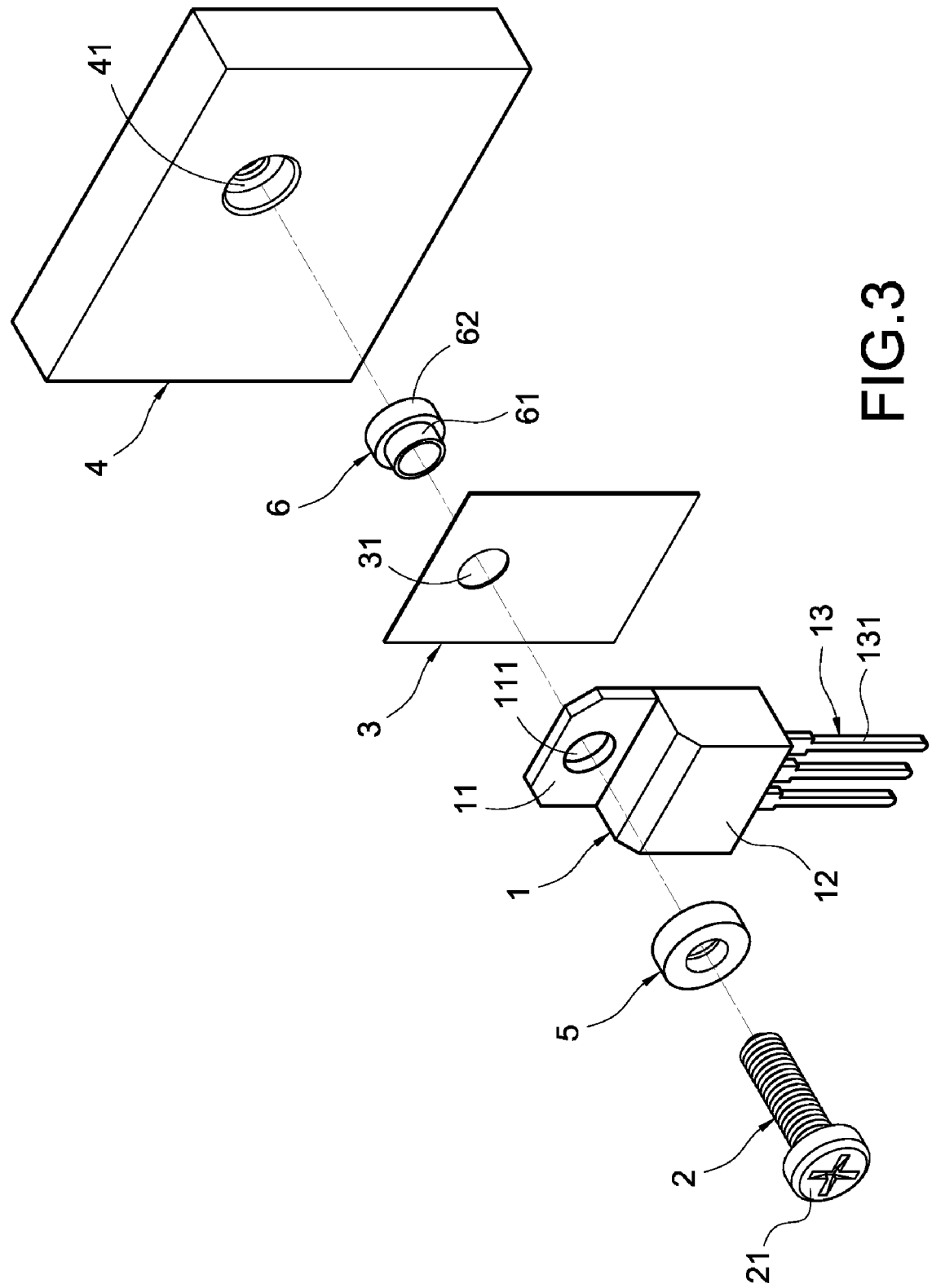
FIG. 3 is an exploded perspective view of the fastening structure for a package component and a heat dissipation unit of the invention.

Please refer to FIG. 3, which is an exploded perspective view of the invention. The integrated device of a heat dissipation unit and a package component includes a non-insulation type package component 1, an insulation sheet 3, a heat dissipation unit 4, a fastening structure having a fastener 2, a washer Sand a sleeve 6.

In this embodiment, the non-insulation type package component 1 is an electronic element with TO-220 specification. It has a front side, a back side and a metal tab 11 with a through hole 111. The non-insulation type package component 1 includes a package 12 and a wire frame 13 having three protrudent pins 131. These pins 131 are used for electrically connecting an external circuit.

The insulation sheet 3 is attached onto the back side of the non-insulation type package component 1. The insulation sheet 3 is provided with a via hole 31 whose diameter is substantially equal to the through hole 111. The heat dissipation unit 4 is located outside the insulation sheet 3 and provided with a tapped hole 41 corresponding to the through hole 111.

The fastener 2 has a head 21, penetrates the washer 5, the non-insulation type package component 1, the insulation sheet 3 and the sleeve 6 in the order named, and finally screws to the heat dissipation unit 4. In other words, the fastener 2 penetrates the through hole 111 and via hole 31 from the front side to the back side.

The washer 5 is put around the fastener 2 and sandwiched between the metal tab 11 and the head 21 of the fastener 2. The sleeve 6 is passed through by the fastener 2. The sleeve 6 has a two-stepped outline, i.e. a narrow portion 61 and a wide portion 62. The diameter of the narrow portion 61 is slightly smaller than that of the via hole 31. The diameter of the wide portion 62 is larger than that of the via hole 31. The narrow portion 61 penetrates into the via hole 31 and through hole 111 from the outside of the insulation sheet 3. The wide portion 62 is sandwiched between the insulation sheet 3 and heat dissipation unit 4. In detail, the narrow portion 61 penetrates into the via hole 31 and through hole 111 from the outside of the insulation sheet 3, the via hole 31 is blocked by the wide portion 62, and the wide portion 62 is embedded into the tapped hole 41. Besides, the washer 5 and sleeve 6 are made of insulator to ensure that the metal tab 11 does not electrically connect with the heat dissipation unit 4 by the fastener 2.

Figure 4:
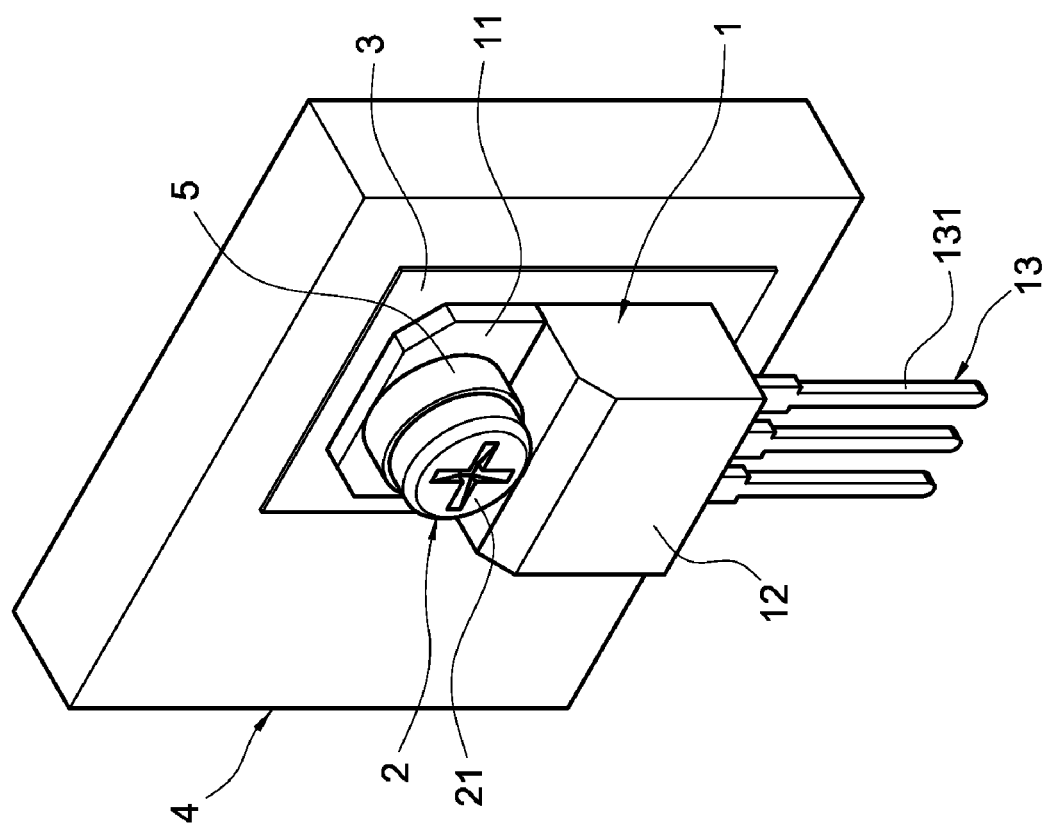
FIG. 4 is an assembled perspective view of the fastening structure for a package component and a heat dissipation unit of the invention.

As for the sequence of manufacture, initially, the narrow portion 61 of the sleeve 6 penetrates into the via hole 31 and trough hole 111 from the outside of the insulation sheet 3, so that the narrow portion 61 can protect the edge of the via hole 31. Next, the through hole 111, via hole 31 and tapped hole 41 are aligned. Finally, the fastener 2 first penetrates the washer 5 and then penetrates the through hole 111, via hole 6 and tapped hole 41. When the fastener 2 is penetrating the through hole 111 and via hole 31, it is the sleeve 6 to be penetrated by the fastener 2. That is, the fastener 2 is not in contact with the insulation sheet 3 to prevent the edge of the via hole 31 from being damaged by the fastener 2. FIG. 4 is an assembled view of the invention.

Figure 5:
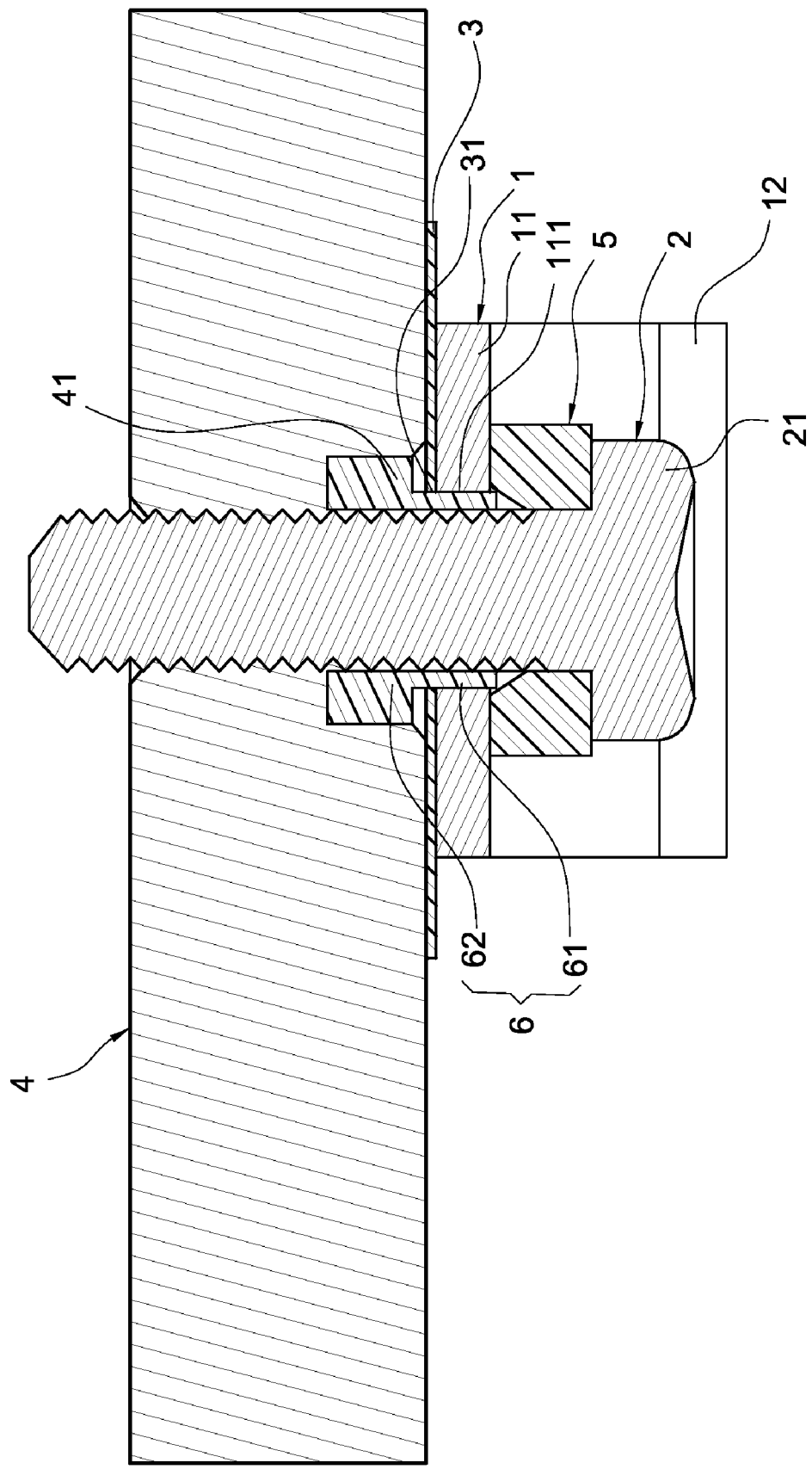
FIG. 5 is a cross-sectional perspective view of the fastening structure for a package component and a heat dissipation unit of the invention.

FIG. 5 is a cross-sectional view of the invention. As can be seen, the narrow portion 61 penetrates the via hole 31 from the back side of the metal tab 11. That is, the narrow portion 61 surrounds the via hole 31. When the fastener 2 is penetrating the through hole 111, it must pass through the sleeve 6. In other words, the via hole 31 is protected by the sleeve 6 to avoid being in contact with the fastener 2. As a result, the via hole 31 will not be damaged by the fastener 2.

Figure 6:
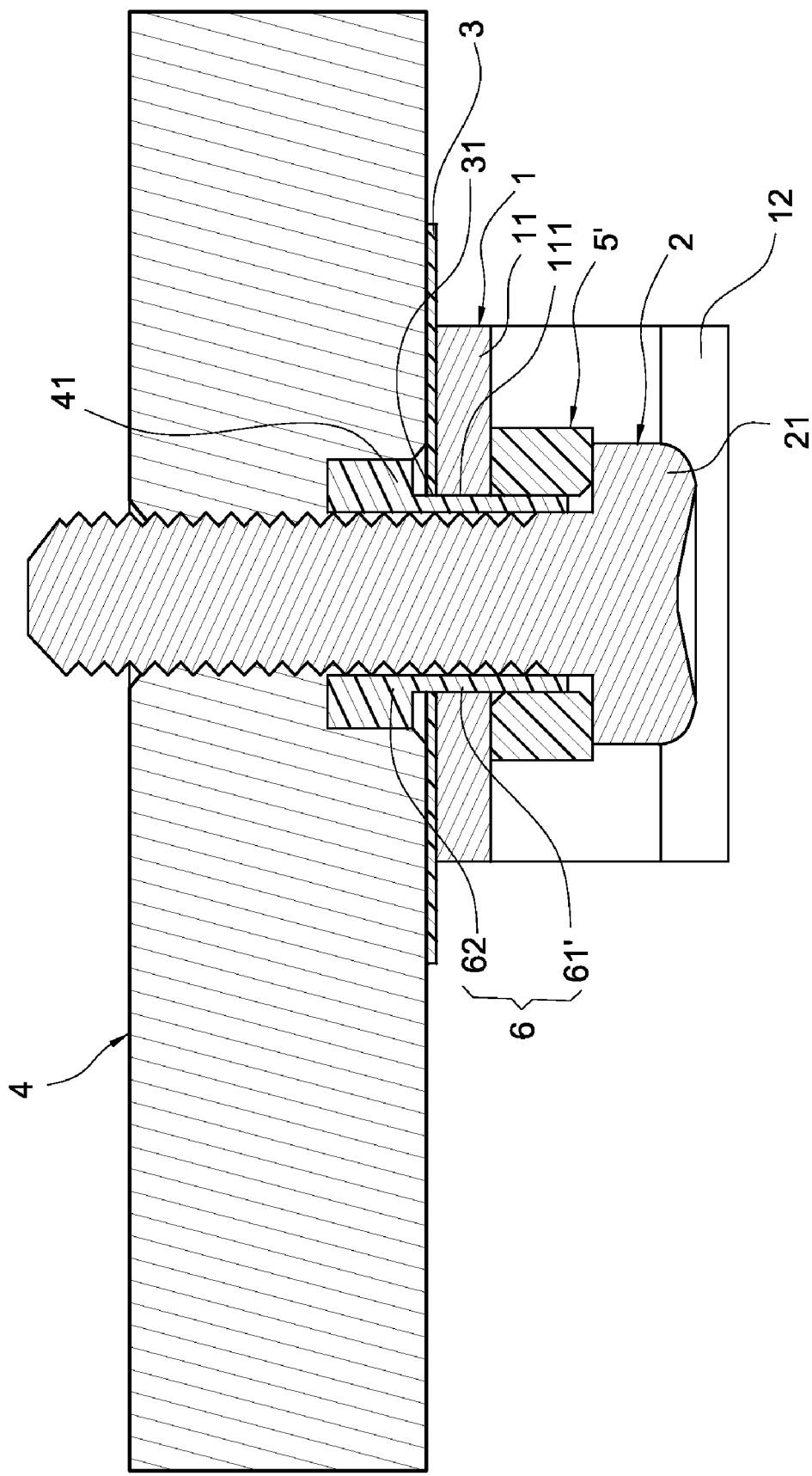
FIG. 6 is a cross-sectional view of another embodiment of the fastening structure for a package component and a heat dissipation unit of the invention.

In the embodiment shown in FIG. 5, the front end of the narrow portion 61 is leant against the washer 5. However, the narrow portion 61 may be slightly prolonged to extend into the inside of the washer 5 as shown in FIG. 6. In this embodiment, the inner diameter of the washer 5' is slightly enlarged and the narrow portion 61' is lightly prolonged to penetrate the washer 5'.

Figure 7:
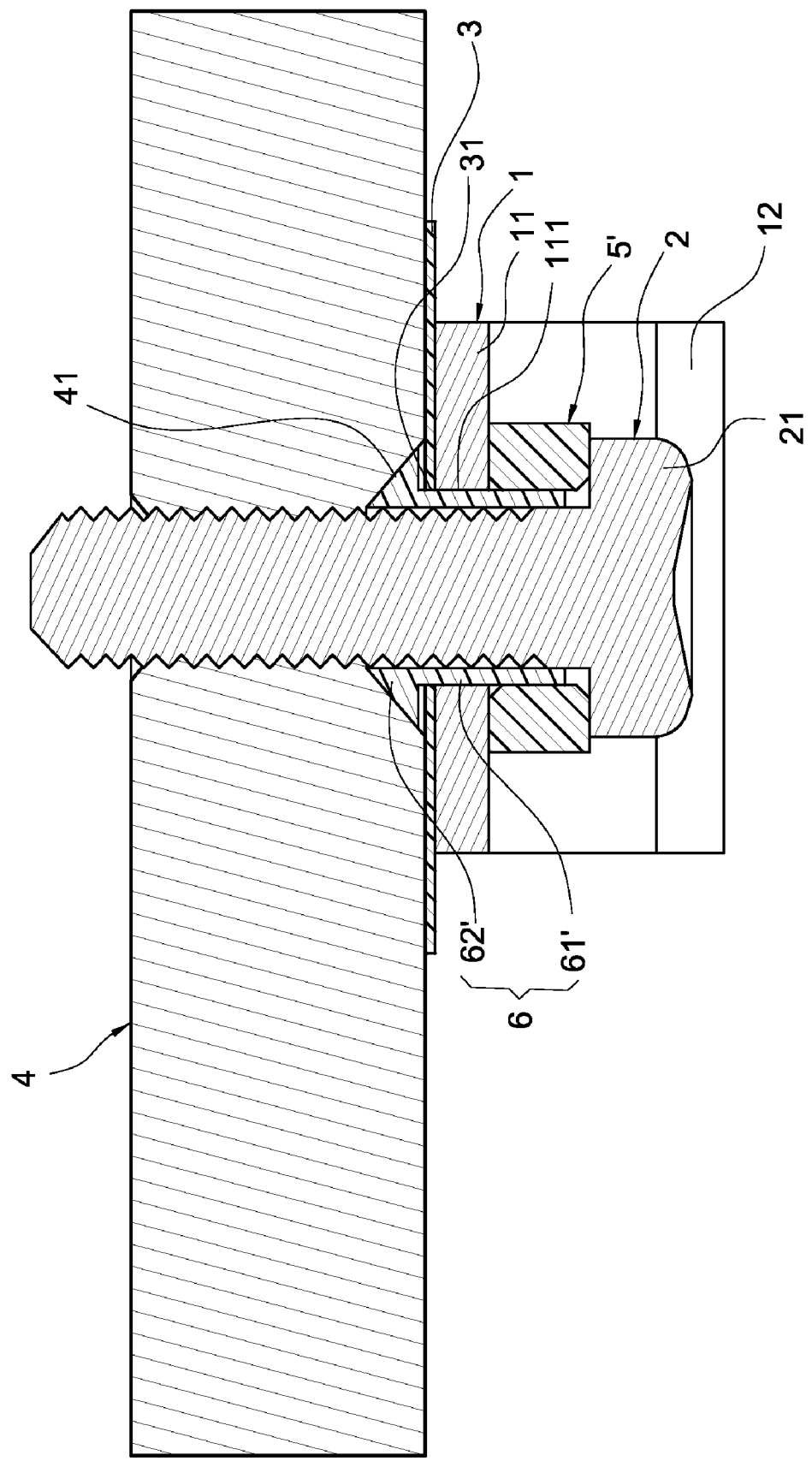
FIG. 7 is a cross-sectional view of still another embodiment of the fastening structure for a package component and a heat dissipation unit of the invention.

FIG. 7 illustrates a modification of the wide portion 62'. The wide portion 62' is formed into a conic shape, and an opening of the tapped hole 41 is also formed into a correspondingly conic shape. This kind of the tapped hole 41 is advantageous to introduction of the fastener 2.

It will be appreciated by persons skilled in the art that the above embodiment has been described by way of example only and not in any limitative sense, and that various alterations and modifications are possible without departure from the scope of the invention as defined by the appended claims.

What is claimed is:

1. An integrated device of heat dissipation unit and package component, comprising:
    a non-insulation type package component, having a front side, a back side and a metal tab with a through hole;
    an insulation sheet, attached on the back side of the non-insulation type package component, and provided with a via hole whose diameter is substantially equal to that of the through hole;
    a heat dissipation unit, located outside the insulation sheet, and provided with a tapped hole corresponding to the through hole;
    a fastener, having a head, penetrating the through hole and the via hole from the front side of the non-insulation type package component, and screwing into the tapped hole;
    a washer, put around the fastener, and sandwiched between the metal tab and the head of the fastener; and
    a sleeve, penetrated by the fastener, having a narrow portion whose diameter is slightly smaller than that of the via hole and a wide portion whose diameter is slightly larger than that of the via hole, wherein the narrow portion penetrates into the via hole and the through hole from an outside of the insulation sheet, and the wide portion is sandwiched between the insulation sheet and the heat dissipation unit,
    wherein the narrow portion penetrates into the washer.

2. The integrated device of claim 1, wherein the non-insulation type package component is an electronic component with TO-220 specification.

3. The integrated device of claim 1, wherein a front end of the narrow portion is leant against the washer.

4. The integrated device of claim 1, wherein the wide portion is embedded into the tapped hole.

5. An integrated device of heat dissipation unit and package component, comprising:
    a non-insulation type package component, having a front side, a back side and a metal tab with a through hole;
    an insulation sheet, attached on the back side of the non-insulation type package component, and provided with a via hole whose diameter is substantially equal to that of the through hole;
    a heat dissipation unit, located outside the insulation sheet, and provided with a tapped hole corresponding to the through hole;
    a fastener, having a head, penetrating the through hole and the via hole from the front side of the non-insulation type package component, and screwing into the tapped hole;
    a washer, put around the fastener, and sandwiched between the metal tab and the head of the fastener; and
    a sleeve, penetrated by the fastener, having a narrow portion whose diameter is slightly smaller than that of the via hole and a wide portion whose diameter is slightly larger than that of the via hole, wherein the narrow portion penetrates into the via hole and the through hole from an outside of the insulation sheet, and the wide portion is sandwiched between the insulation sheet and the heat dissipation unit,
    wherein the wide portion is embedded into the tapped hole and formed into a conic shape, and an opening of the tapped hole is also formed into a conic shape for accommodating the wide portion.

6. A fastening structure for fastening a heat dissipation unit on a non-insulation type package component and sandwiching an insulation sheet therebetween, the fastening structure comprising:

a fastener, having a head, penetrating the non-insulation type package component and the insulation sheet, and screwing into the heat dissipation unit;

a washer, put around the fastener, and sandwiched between the non-insulation type package component and the head of the fastener; and a sleeve, penetrated by the fastener, having a narrow portion and a wide portion, wherein the narrow portion penetrates into the non-insulation type package component through the insulation sheet, and the wide portion is sandwiched between the insulation sheet and the heat dissipation unit, wherein the narrow portion penetrates into the washer.

7. The fastening structure of claim 6, wherein the non-insulation type package component is an electronic component with TO-220 specification.

8. The fastening structure of claim 6, wherein the non-insulation type package component has a metal tab with a through hole, the insulation sheet is provided with a via hole whose diameter is substantially equal to that of the through hole, the heat dissipation unit is provided with a tapped hole corresponding to the through hole, and the fastener penetrates the through hole and the via hole to screw into the tapped hole.

9. The fastening structure of claim 6, wherein a front end of the narrow portion is leant against the washer.

10. The fastening structure of claim 8, wherein the wide portion is embedded into the tapped hole.

11. The fastening structure of claim 10, wherein the wide portion is formed into a conic shape, and an opening of the tapped hole is also formed into a conic shape for accommodating the wide portion.

* * * * *